(12) United States Patent
Correia et al.

(10) Patent No.: US 12,019,135 B2
(45) Date of Patent: Jun. 25, 2024

(54) MOTION CORRECTED TRACER-KINETIC MAPPING USING MRI

(71) Applicant: KONINKLIJKE PHILIPS N.V., Eindhoven (NL)

(72) Inventors: Teresa Correia, Eindhoven (NL); Torben Schneider, Guilford (GB); Amedeo Chiribiri, Turin (IT)

(73) Assignee: Koninklijke Philips N.V., Eindhoven (NL)

(*) Notice: Subject to any disclaimer, the term of this patent is extended or adjusted under 35 U.S.C. 154(b) by 151 days.

(21) Appl. No.: 17/760,777

(22) PCT Filed: Sep. 14, 2020

(86) PCT No.: PCT/EP2020/075601
§ 371 (c)(1),
(2) Date: Mar. 16, 2022

(87) PCT Pub. No.: WO2021/052898
PCT Pub. Date: Mar. 25, 2021

(65) Prior Publication Data
US 2022/0373631 A1   Nov. 24, 2022

(30) Foreign Application Priority Data
Sep. 20, 2019   (EP) .................................. 19198546

(51) Int. Cl.
*G01V 3/00* (2006.01)
*G01R 33/54* (2006.01)
(Continued)

(52) U.S. Cl.
CPC ..... *G01R 33/56509* (2013.01); *G01R 33/543* (2013.01); *G01R 33/561* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 9,076,201 B1*  7/2015  Negahdar ................. G06T 7/38
2006/0038891 A1*  2/2006  Okutomi .............. H04N 23/843
                                                          348/222.1
(Continued)

OTHER PUBLICATIONS

Kellman, P., et al.: Myocardial perfusion cardiovascular magnetic resonance: optimized dual sequence and reconstruction for quantification. J Cardiovasc Magn Reson 19(42), 1-14 (2017).
(Continued)

*Primary Examiner* — Walter L Lindsay, Jr.
*Assistant Examiner* — Frederick Wenderoth

(57) ABSTRACT

Disclosed herein is a medical system (100, 300, 500) comprising a memory (110) storing machine executable instructions (120) and a magnetic resonance reconstruction module (122). The magnetic resonance reconstruction module is configured to reconstruct a motion corrected tracer-kinetic map (126) from measured k-space data (124). The measured k-space data is undersampled. The measured k-space data is T1 weighted. The measured k-space data is dynamic contrast enhanced k-space data. The medical system further comprises a processor (104) configured for controlling the medical system. Execution of the machine executable instructions causes the processor to: receive (200) the measured k-space data; and reconstruct (202) the motion corrected tracer-kinetic map by inputting the measured k-space data into the magnetic resonance reconstruction module. The magnetic resonance reconstruction module (122) is configured to reconstruct the motion corrected tracer-kinetic map as a direct model-based reconstruction from the measured k-space data (124).

19 Claims, 10 Drawing Sheets

(51) Int. Cl.
*G01R 33/561* (2006.01)
*G01R 33/565* (2006.01)

(58) Field of Classification Search
USPC .......................................... 324/309
See application file for complete search history.

(56) References Cited

U.S. PATENT DOCUMENTS

| | | | |
|---|---|---|---|
| 2015/0363948 A1* | 12/2015 | Leahy | A61B 6/504 600/425 |
| 2016/0206272 A1* | 7/2016 | Kyriakou | A61B 6/5264 |
| 2017/0325709 A1* | 11/2017 | Nayak | G01R 33/5601 |

OTHER PUBLICATIONS

Hsu, L.Y., et al.: Diagnostic performance of fully automated pixel-wise quantitative myocardial perfusion imaging by cardiovascular magnetic resonance. JACC Cardiovasc Imaging 11(5), 697-707 (2018).

Otazo, R. et al.: Combination of compressed sensing and parallel imaging for highly accelerated first-pass cardiac perfusion MRI. Magn Reson Med 64(3), 767-776 (2010).

Vitanis, V., et al.: High resolution three-dimensional cardiac perfusion imaging using compartment-based k-t principal component analysis. Magn Reson Med 65(2), 575-587 (2011).

Petibon, Y., et al.: Direct parametric reconstruction in dynamic PET myocardial perfusion imaging: in vivo studies. Phys Med Biol 62(9), 3539 (2017).

Guo, Y., et al.: Direct estimation of tracer-kinetic parameter maps from highly undersampled brain dynamic contrast enhanced MRI. Magn Reson Med 78(4), 1566-1578 (2017).

Dikaios, N., et al.: Direct parametric reconstruction from undersampled (k,t)-space data in dynamic contrast enhanced MRI. Med Image Anal 18(7), 989-1001 (2014).

Ulas, Cagdas, et al. "Convolutional Neural Networks for Direct Inference of Pharmacokinetic Parameters: Application to Stroke Dynamic Contrast-Enhanced MRI." Frontiers in neurology 9 (2018).

Ulas C. et al. (2018) Direct Estimation of Pharmacokinetic Parameters from DCE-MRI Using Deep CNN with Forward Physical Model Loss. In: Frangi A., Schnabel J., Davatzikos C., Alberola-López C., Fichtinger G. (eds) Medical Image Computing and Computer Assisted Intervention—MICCAI 2018. MICCAI 2018. Lecture Notes in Computer Science, vol. 11070. Springer, Cham. https://doi.org/10.1007/978-3-030-00928-1_5.

Correia et al "Model Based Reconstruction for Highly Accelerated First Pass Perfusion Cardiac MRI" 12th European Conf. on Computer Vision, p. 514-522 Oct. 10, 2019.

Pedersen et al "A Unifying Model of Perfusion and Motion Applied to Reconstruction of Sparsely Sampled Free-Breathing Myocardial Perfusion MRI" Biomedical Imaging: From Nano to Macro, Apr. 14, 2010 p. 752-755.

Herold et al "Analysis of Myocardial Perfusion MRI" Journal of Magnetic Resonance Imaging, vol. 19, No. 6 Jan. 1, 2004 p. 758-770.

He et al "Diagnostic Performance of Self-Navigated Whole Heart Constrast Enhanced Coronary 3-T MR Angiography" Radiology, vol. 281, p. 401-408 May 17, 2016.

International Search Report and Written Opinion from PCT/EP2020/075601 dated Dec. 9, 2020.

* cited by examiner

MOTION CORRECTED TRACER-KINETIC MAPPING USING MRI

CROSS REFERENCE TO RELATED APPLICATIONS

This application is a U.S. national phase application of International Application No. PCT/EP2020/075601 filed on Sep. 14, 2020, which claims the benefit of EP Application Serial No. 19198546.4 filed on Sep. 20, 2019 and is incorporated herein by reference.

FIELD OF THE INVENTION

The invention relates to Magnetic Resonance Imaging, in particular to dynamic contrast enhanced magnetic resonance imaging.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field or the main magnetic field. Various quantities or properties of the subject can be measured spatially using MRI. In some MRI techniques a contrast agent such as gadolinium can be injected into a subject which affects the T1 relaxation time. Measurements taken over time can be used to determine the transport of the contrast agent through the subject. So called tracer kinetic models can then be fit to the transport of the subject to determine quantities such as perfusion.

The journal article Guo et. al., (2017), Direct estimation of tracer-kinetic parameter maps from highly undersampled brain dynamic contrast enhanced MRI. Magn. Reson. Med, 78: 1566-1578. doi:10.1002/mrm.26540 discloses a reconstruction method that involves solving a nonlinear least squares optimization problem that includes explicit use of a full forward model to convert parameter maps to (k,t)-space, utilizing the Patlak TK model. The proposed scheme is compared against an indirect method that creates intermediate images by parallel imaging and compressed sensing before to TK modeling.

SUMMARY OF THE INVENTION

The invention provides for a medical system, a computer program product, and a method in the independent claims. Embodiments are given in the dependent claims.

The method discussed in Guo et. al. is used for brain Dynamic Contrast Enhanced (DCE) Magnetic Resonance Imaging (MRI). When imaging the brain, it is straightforward to restrain the subject's head. For other DCE MRI techniques such as first-pass perfusion cardiac CDE MRI or abdominal DCE MRI the techniques described in Guo et al (2007) do not work. Embodiments may provide for a means of producing tracer-kinetic (TK) maps by providing motion correction. This may be, for example, done in several different ways. In some embodiments the optimization problem is modified to include additional terms that correct for subject motion. In other embodiments a trained neural network may be trained to compensate for subject motion such as breathing and/or cardiac motion. In yet other embodiments measured k-space data is first used to calculate motion corrected k-space data. The motion corrected k-space data is then used to calculate motion corrected tracer-kinetic maps. Herein references to k-space data are understood to refer to k-space data that is sampled as both a function of location in k-space as well as time.

In one aspect the invention provides for a medical system that comprises a memory that stores machine-executable instructions and a magnetic resonance reconstruction module. The magnetic resonance reconstruction module is configured to reconstruct a motion corrected tracer-kinetic map from measured k-space data. The measured k-space data is undersampled. The measured k-space data is T1 weighted. The measured k-space data is dynamic contrast enhanced k-space data.

A medical system as used herein encompasses either a workstation or a computer configured for processing medical imaging data and/or a system for acquiring this medical imaging data. For example, in one instance the medical system may be a workstation. In another example the medical system may be a combination of a magnetic resonance imaging system and a medical system.

In dynamic contrast enhanced or DCE magnetic resonance imaging repeated measurements over a period of time can be used to determine a DCE signal data which may result in a change in the D1 contrast of measured magnetic resonance images. This DCE signal data may be converted into gadolinium concentrations. Once the gadolinium concentration is determined as a function of time it is possible to fit a tissue model to model the transport of the gadolinium through the subject. This tissue model is a so-called tracer-kinetic map. A variety of tracer-kinetic maps exist. A common one is the Tofts model. In this model there is a fractional plasma volume for part of the voxel and there is a fractional extravascular space also. The transport of the gadolinium from the fractional plasma volume to the extravascular extracellular space may be used to measure the perfusion. In cardiac DCE magnetic resonance imaging this measurement of the perfusion may be a measurement of the health or wellbeing of the subject. The motion corrected tracer-kinetic map as used herein encompasses the parameters which are fit to a model of contrast agent or gadolinium transport.

The medical system further comprises a processor that is configured for controlling the medical system. Execution of the machine-executable instructions causes the processor to receive the measured k-space data. The measured k-space data may for example be retrieved from a memory storage device or retrieved via a network. In other examples the machine-executable instructions may control a medical imaging system or magnetic resonance imaging system to acquire the measured k-space data. Execution of the machine-executable instructions further cause the processor to reconstruct the motion corrected tracer-kinetic map by inputting the measured k-space data into the magnetic resonance reconstruction module. This embodiment may be beneficial because the k-space data has been undersampled. By undersampled this means that the k-space data does not fulfill the Nyquist criterion.

However, in repeated measurements that make up the measured k-space data there may be a redundancy in measurements which allows the k-space data to be undersampled. The measured k-space data can for example be directly used to calculate the motion corrected tracer-kinetic map from the magnetic resonance reconstruction module. This may provide for an increased rate in acquiring the measured k-space data as well as an improved quality or correctness of the motion corrected tracer-kinetic map.

In another embodiment, the magnetic resonance reconstruction module is configured to reconstruct the motion corrected tracer-kinetic map as a direct model-based reconstruction from the measured k-space data.

In another embodiment the magnetic resonance reconstruction module is configured for solving the motion corrected tracer-kinetic map as an optimization problem. The optimization problem comprises a motion compensating regularization term. This embodiment may be beneficial because the intermediate steps which are typically used for calculating a tracer-kinetic map may be skipped. The use of an optimization problem enables the k-space data to be more highly undersampled. This may for example enable the measured k-space data to be acquired more rapidly. The use of a regularization term may enable greater motion compensation.

In another embodiment the optimization problem is a single optimization problem that directly solves for the motion corrected tracer-kinetic map from the measured k-space data.

In another embodiment the motion compensating regularization term is formulated from a deformation map of the motion corrected tracer-kinetic map.

In another embodiment, the deformation map has a time and spatial dependency.

In another embodiment, the motion compensating regularization term is formulated as a stored energy function dependent upon the deformation map.

In another embodiment, the motion compensating regularization term is formulated as a hyper elastic material model dependent upon the deformation map.

In another embodiment, the motion compensating regularization term is formulated as a curvature-based regularization term dependent upon the deformation map.

In another embodiment, the motion compensating regularization term is formulated as a free-form deformation model that uses a cubic B-spline model dependent upon the deformation map.

In another embodiment, the motion compensating regularization term is formulated as an affine transformation model dependent upon the deformation map.

In another embodiment, the motion compensating regularization term is a non-rigid motion compensating regularization term.

In another embodiment, the motion compensating regularization term is a rigid motion compensating regularization term.

The motion compensating regularization term may for example be a rigid or affine or non-rigid motion compensating regularization term. This may be performed in a variety of ways. For rigid transformations it may result in a phase shift in the measured k-space data. In other examples a stored energy function of a hyperelastic material or a curvature-based regularization term or even a free-form deformation model using a cubic B-spline model may be used. This may enable non-rigid motion compensation for the motion corrected tracer-kinetic map.

In another embodiment the optimization problem is formulated as the minimalization of the motion compensating regularization term plus a norm of a difference between the measured k-space data and a k-space model configured to map the undersampled k-space data. This embodiment may be beneficial because it may provide for a means of calculating the motion corrected tracer-kinetic map from the measured k-space data without intermediate steps. This reuses the redundancy of k-space data measurements in the measured k-space data and also enables the measured k-space data to be more highly undersampled.

In another embodiment the norm is an L2 norm. The use of an L2 norm has been shown to function properly in numerical methods. However, numerically other norms may also be used.

In another embodiment the optimization problem comprises the medical system of claim 2 or 3, wherein the optimization problem comprises:

$$(TK(r), M(r, t)) = \argmin_{TK(r), M(r,t)} \{norm[d(k, t) - f(TK(r), M(r, t))] + R(M(r, t))\}$$

wherein r is the spatial position, wherein t is the time, wherein TK(r) is the terms of a tracer-kinetic map, wherein R(M(r,t)) is the motion compensating regularization term, wherein d(k,t) is the measured k-space data, wherein M(r,t) is a deformation map, wherein f(TK(r), M(r,t)) is a forward model of k-space data for a given TK(r) and M(r,t), and wherein norm is a mathematical norm.

The term TK is used to represent the terms of a tracer-kinetic map generically. The term norm is used to represent a generic or general norm that is a mathematical norm. In some instances the norm may be the L2 norm.

Different tracer-kinetic models may be substituted for TK(r) above, for example the Patlak TK model may be subsisted into the equation:

$$(\hat{K}^{Trans}(r), \hat{v}_p(r), M(r, t)) =$$
$$\argmin_{K^{Trans}(r), v_p(r), M(r,t)} \left\| d(k, t) - f(K^{Trans}(r), v_p(r), M(r, t)) \right\|_2^2 + R_{hyper}(M(r, t))$$

In the above example, the L2 norm is also optionally substituted for the generalized norm. Further, the hyperelasticity-based regularizer, $R_{hyper}$, allows for large and smooth deformations while maintaining an elastic behavior. Other models could be used such as, curvature-based regularization, affine transformations and free-form deformations (FFD) parameterized using cubic B-splines models and others can be used. This problem can, for example, be solved using an alternating minimization scheme.

The above embodiments and description may be modified such that a single optimization problem without the regularization term is formulated. This provides for additional embodiments. In one such embodiment, the single optimization problem becomes $$(TK(r), M(r, t)) = \argmin_{TK(r), M(r,t)} \{norm[d(k, t) - f(TK(r), M(r, t))]\}$$

The deformation map M(r,t) is still present and is able to correct for motion of the subject. The other terms in the above equation are as was previously described above.

In another similar embodiment, the optimization problem is formulated as a minimization of a norm of a difference between the measured k-space data and a k-space model configured to map the motion corrected tracer-kinetic map to the under sampled k-space data. This embodiment also has the advantage of motion correction without the regularization term.

In another embodiment the magnetic resonance reconstruction module is a neural network. The neural network is trained to output the motion corrected tracer-kinetic map in response to inputting the k-space data. This embodiment may be beneficial because it may be very efficient to measure the k-space data and then directly receive the motion corrected tracer-kinetic map.

In another embodiment the neural network may be trained by using k-space data that is for the particular volume that is of interest. For example, in the case of generating the motion corrected tracer-kinetic map for cardiac situations the training data may be k-space data of the cardiac region and a motion corrected tracer-kinetic map.

In another embodiment the neural network is trained using motion corrected tracer-kinetic map paired with simulated motion corrected k-space data. For example, a motion corrected tracer-kinetic map may be obtained using a variety of means. For example, a motion corrected tracer-kinetic map may be determined using measured k-space data which is fully sampled. The motion correction may then be performed using imaging techniques such as deformable or non-deformable mappings between a series of images. Regardless of how the motion corrected tracer-kinetic map is reconstructed the equations can be worked backwards to create simulated motion corrected k-space data. For example, the k-space data for a fully sampled motion corrected tracer-kinetic map may be calculated. A subset of this data may be taken as being the undersampled k-space data. Motion artifacts can then be added artificially to this k-space data.

In another embodiment execution of the machine-executable instructions further causes the processor to calculate the motion corrected k-space data using the measured k-space data. The tracer-kinetic map is calculated by inputting the motion corrected k-space data into the magnetic resonance reconstruction module. In this embodiment the measured k-space data is motion corrected before it is inserted. This for example may be useful in correcting certain types of motion. For example, rigid body motion of the subject can be compensated for in the k-space data by changing the phase of the measured k-space data. This may for example be accomplished in different ways. The measured k-space data may be self-navigating k-space data. For example, the k-space measurements may be concentrated in a central region and this data alone may be sufficient for detecting rigid body transformations of the subject. In another example subsequent acquisitions of the measured k-space data may be used for generating individual images that are then used to calculate a translation which is used to correct the phase in k-space.

Other methods may also include the use of image navigators, such as two-dimensional navigators, that are additionally acquired using the magnetic resonance imaging system as well as external navigators such as respiratory bellows, cameras, or respiration belts.

In another embodiment the magnetic resonance reconstruction module is configured for solving for the motion corrected tracer-kinetic map as an optimization problem or using a trained convolutional neural network. This embodiment may be similar to the previous mentioned one but the motion correction may be performed before the k-space data is input into the magnetic resonance reconstruction module.

In another embodiment the tracer-kinetic map is a mapping of any one of the following: a relative extracellular volume, an intravascular plasma volume, a plasma flow, a permeability-surface area product, a tissue extracellular extravascular space, an influx mask transfer rate of a contrast agent such as gadolinium, a myocardial blood flow, and combinations thereof.

In another embodiment the measured k-space data is first-pass perfusion cardiac-k-space data. This embodiment may be beneficial because the undersampling may help to reduce the significance of motion artifacts. Additionally, when doing first-pass perfusion cardiac magnetic resonance imaging there may be respiratory as well as cardiac motion. The motion compensation may assist in improving the quality of the motion corrected tracer-kinetic map.

In another embodiment the measured k-space data is abdominal dynamic contrast-enhanced magnetic resonance imaging data. This embodiment may be beneficial because the motion correction may help compensate for abdominal motion caused by respiration of the subject.

In another embodiment the measured k-space data is multi-coil k-space data. For example, there may be multiple receive coils which are used to receive the measured k-space data. This may be particularly beneficial because when multi-coil k-space data is acquired it is typically undersampled and then reconstructed using something similar to a SENSE magnetic resonance imaging protocol. The magnetic resonance reconstruction module may be configured for using the k-space data and combining it using coil sensitivities.

In another embodiment the measured k-space data is undersampled by at least a factor of 5.

In another embodiment the measured k-space data is undersampled by at least a factor of 10.

In another embodiment the measured k-space data is undersampled by over a factor of 20.

In another embodiment the measured k-space data is undersampled by at least a factor of 30.

In another embodiment the measured k-space data is undersampled by at least a factor of 40.

In another embodiment the measured k-space data is undersampled by at least a factor of 50.

In another embodiment the measured k-space data is undersampled by at least a factor of 60.

In another embodiment the measured k-space data is undersampled by a factor under 70.

In another embodiment the measured k-space data is undersampled by at least a factor of 80.

In another embodiment the medical system further comprises a magnetic resonance imaging system configured for acquiring the measured k-space data from an imaging zone. The memory further contains pulse sequence commands. The pulse sequence commands are configured to acquire the measured k-space data according to a first-pass perfusion cardiac magnetic resonance imaging protocol or an abdominal dynamic contrast-enhanced magnetic resonance imaging protocol. Execution of the machine-executable instructions further causes the processor to control the magnetic resonance imaging system with the pulse sequence commands to acquire the measured k-space data. This embodiment may be beneficial because the medical system may provide for motion corrected tracer-kinetic maps which have a reduced amount of motion artifacts.

In another embodiment the pulse sequence commands are configured for acquiring the k-space data using a self-navigating k-space sampling pattern. For example, the self-navigating k-space sampling pattern may be a so-called stack-of-stars. In the stack-of-stars a core k-space sampling pattern is rotated in k-space. The central region of k-space is sampled in every measurement and the central k-space data can be used for performing self-navigation.

In another aspect the invention provides for a method of operating a medical system. The method comprises receiving measured k-space data. The method further comprises reconstructing a motion corrected tracer-kinetic map by inputting the measured k-space data into a magnetic resonance reconstruction module. The magnetic resonance reconstruction module is configured to reconstruct a motion corrected tracer-kinetic map from measured k-space data. The measured k-space data is undersampled. The measured k-space data is T1 weighted. The measured k-space data is dynamic contrast enhanced k-space data.

In another aspect the invention provides for a computer program product comprising machine-executable instructions for execution by a processor controlling a medical system. The machine-executable instructions comprise a magnetic resonance reconstruction module configured to reconstruct a motion corrected tracer-kinetic map from measured k-space data. The measured k-space data is undersampled. The measured k-space data is T1 weighted. The measured k-space data is dynamic contrast-enhanced k-space data. Execution of the machine-executable instructions causes the processor to receive the measured k-space data. Execution of the machine-executable instructions further causes the processor to reconstruct the motion corrected tracer-kinetic map by inputting the measured k-space data into the magnetic resonance reconstruction module.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

k-space data is defined herein as being the recorded measurements of radio frequency signals emitted by atomic spins using the antenna of a Magnetic resonance apparatus during a magnetic resonance imaging scan. k-space data is an example of medical image data. A Magnetic Resonance Imaging (MRI) image or MR image is defined herein as being the reconstructed two- or three-dimensional visualization of anatomic data contained within the magnetic resonance imaging data. This visualization can be performed using a computer.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
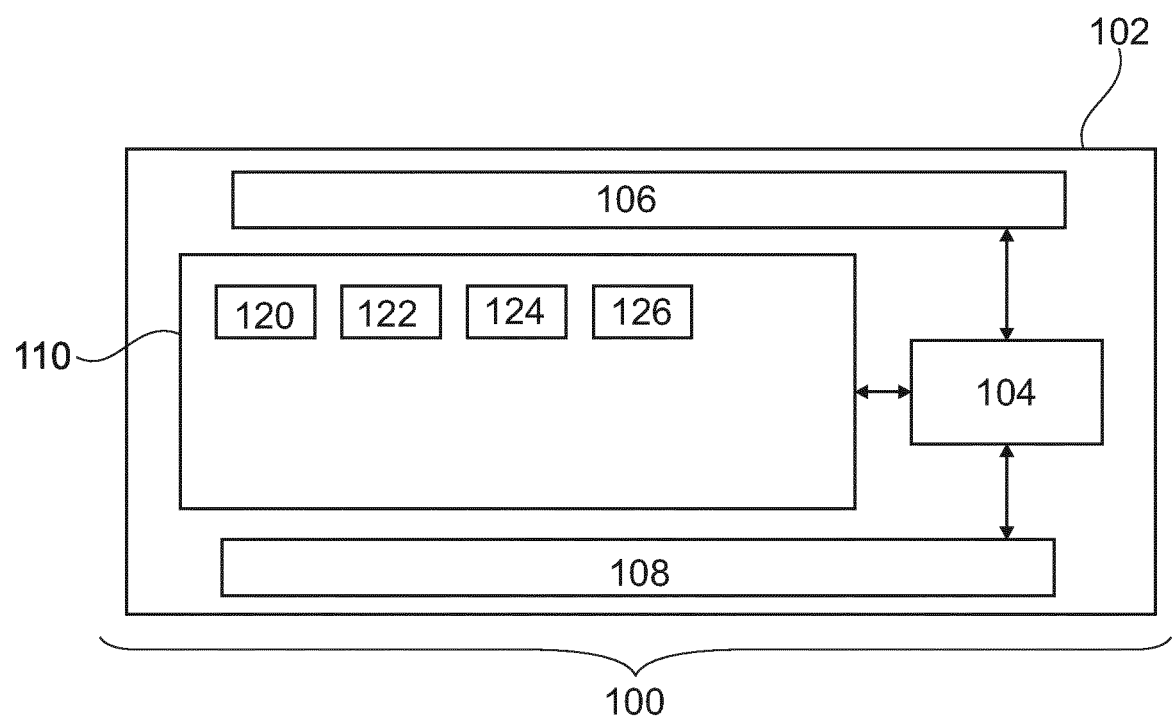
FIG. 1 illustrates a medical system.

FIG. 1 illustrates an embodiment of a medical system 100. The medical system 100 is shown as comprising a computer 102. The computer 102 comprises a processor 104. The processor 104 is intended to represent one or more processing cores distributed amongst one or more computers. For example, the computer 102 may actually represent one or more computers that are connected via a network. The processor 104 is shown as being connected to a hardware interface 106. The hardware interface 106 may for example enable the processor 104 to communicate and/or control other components of the medical system 100. The processor 104 is shown as further being connected to an optional user interface 108. The processor 104 is also connected to the memory 110.

The memory 110 may be any combination of memory which is accessible to the processor 104. This may include such things as main memory, cached memory, and also non-volatile memory such as flash RAM, hard drives, or other storage devices. In some examples the memory 110 may be considered to be a non-transitory computer-readable medium.

The memory 110 is further shown as containing machine-executable instructions 120. The machine-executable instructions 120 enable the processor 104 to control other components of the medical system 100 as well as to perform basic data analysis and image processing techniques. The memory 110 is further shown as containing a magnetic resonance reconstruction module 122 that is also part of the machine-executable instructions 120. The magnetic resonance reconstruction module may be executable code which enables the processor 104 to take measured k-space data and reconstruct a tracer-kinetic map. The memory 110 is further shown as containing a measured k-space data 124. The memory 110 is further shown as containing motion corrected tracer-kinetic map 126 that was reconstructed by inputting the measured k-space data 124 into the magnetic resonance reconstruction module 122.

Figure 2:
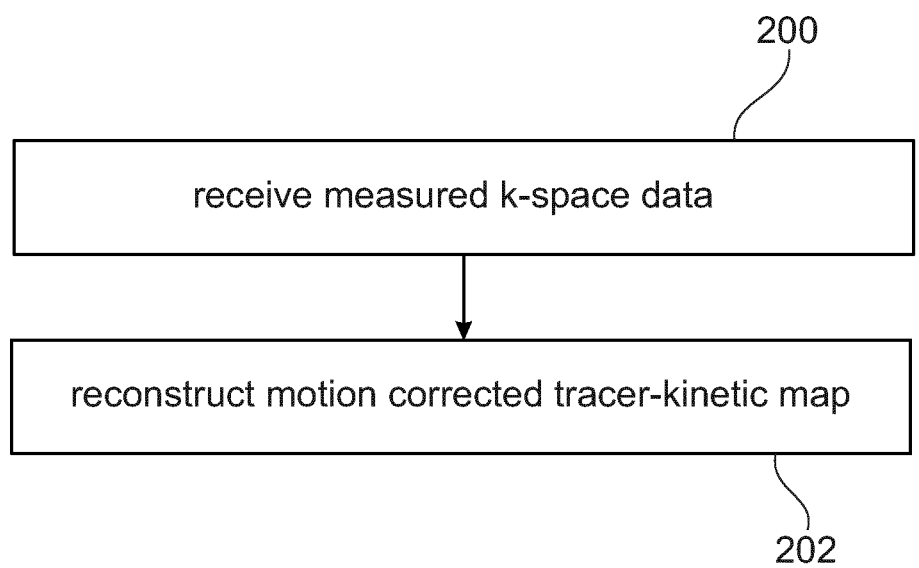
FIG. 2 shows a method of operating the medical system of FIG. 1.

FIG. 2 shows a flowchart which illustrates a method of operating the medical system 100 of FIG. 1. First in step 200 the measured k-space data 124 is received. Next in step 202 the motion corrected tracer-kinetic map 126 is reconstructed by inputting the measured k-space data 124 into the magnetic resonance reconstruction module 122.

Figure 3:
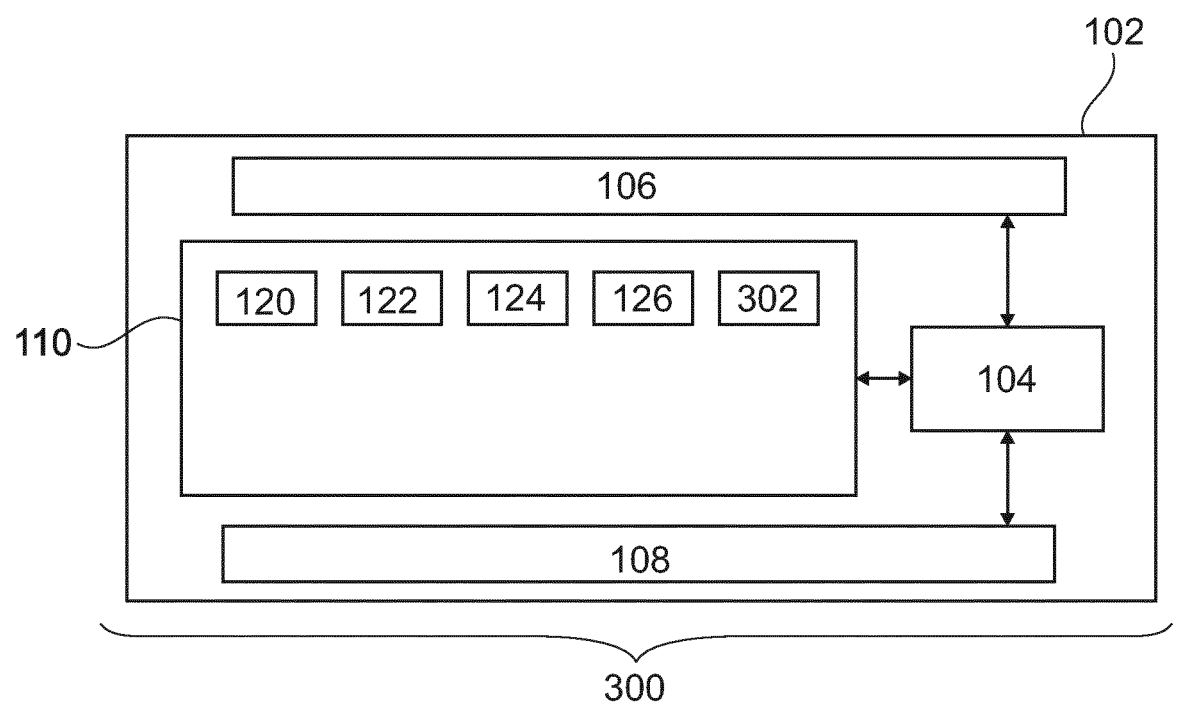
FIG. 3 illustrates a further example of medical system.

FIG. 3 illustrates a further embodiment of a medical system 300. The medical system in FIG. 3 is similar to the medical system 100 depicted in FIG. 1. The medical system 300 in FIG. 3 is modified so that instead of directly inputting the measured k-space data 124 into the magnetic resonance reconstruction module 122 the processor 104 uses the machine-executable instructions 120 to first correct/calculate motion corrected k-space data 302 from the measured k-space data 124. Then the motion corrected k-space data 302 is input into the magnetic resonance reconstruction module 122 and the motion corrected tracer-kinetic map 126 is output. The measured k-space data 124 may for instance have self-navigation k-space data or there may be an external system signal which is used to measure a motion phase of a subject. Any of these may be used to calculate the motion corrected k-space data 302 from the measured k-space data 124. In particular rigid body transformations between acquired portions of the measured k-space data 124 can be corrected as phase changes in the measured k-space data 124 to calculate the motion corrected k-space data 302.

Figure 4:
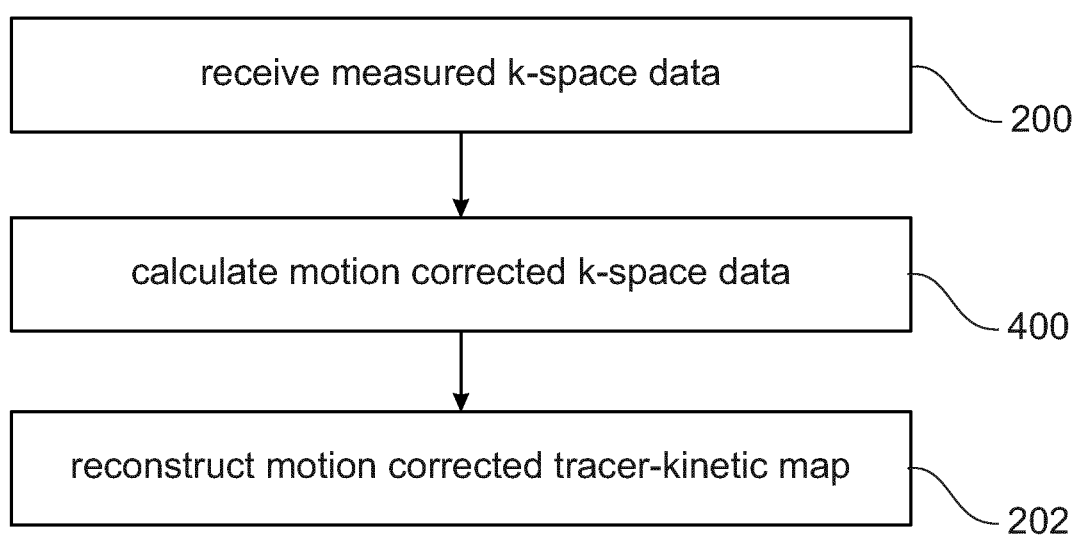
FIG. 4 shows a method of operating the medical system of FIG. 1.

FIG. 4 shows a flowchart which illustrates a method of operating the medical system 300 of FIG. 3. First in step 200 is performed as is illustrated in FIG. 2. Next the method proceeds to step 400 where the motion corrected k-space data 302 is calculated using the measured k-space data 124. After step 400 is performed the method proceeds to step 202 as was illustrated in FIG. 2.

Figure 5:
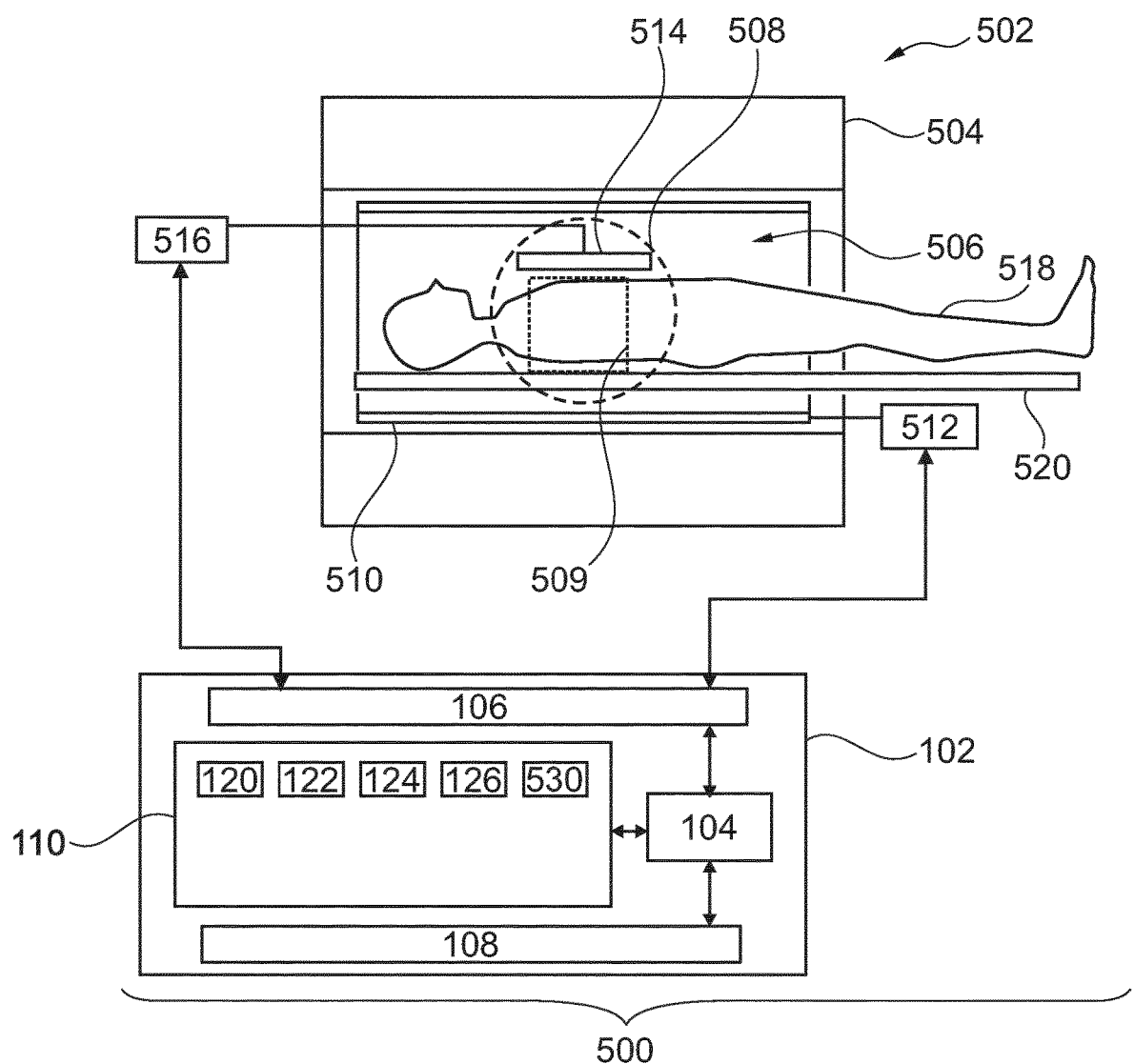
FIG. 5 illustrates a further example of a medical system.

FIG. 5 illustrates a further embodiment of a medical system 500. The medical system 500 is similar to the medical system 100 depicted in FIG. 1 except the medical system 500 additionally comprises a magnetic resonance imaging system 502. The features of the medical system 300 depicted in FIG. 3 may also be incorporated into the medical system 500 depicted in FIG. 5.

The magnetic resonance imaging system 502 comprises a magnet 504. The magnet 504 is a superconducting cylindrical type magnet with a bore 506 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils.

Within the bore 506 of the cylindrical magnet 504 there is an imaging zone 508 where the magnetic field is strong and uniform enough to perform magnetic resonance imaging. A field of view 509 is shown within the imaging zone 508. The magnetic resonance data that is acquired typically acquired for the field of view 509. A subject 518 is shown as being supported by a subject support 520 such that at least a portion of the subject 518 is within the imaging zone 508 and the field of view 509.

Within the bore 506 of the magnet there is also a set of magnetic field gradient coils 510 which is used for acquisition of preliminary magnetic resonance data to spatially encode magnetic spins within the imaging zone 508 of the magnet 504. The magnetic field gradient coils 510 connected to a magnetic field gradient coil power supply 512. The magnetic field gradient coils 510 are intended to be representative. Typically magnetic field gradient coils 510 contain three separate sets of coils for spatially encoding in three orthogonal spatial directions. A magnetic field gradient power supply supplies current to the magnetic field gradient coils. The current supplied to the magnetic field gradient coils 510 is controlled as a function of time and may be ramped or pulsed.

Adjacent to the imaging zone 508 is a radio-frequency coil 514 for manipulating the orientations of magnetic spins within the imaging zone 508 and for receiving radio transmissions from spins also within the imaging zone 508. The radio frequency antenna may contain multiple coil elements. The radio frequency antenna may also be referred to as a channel or antenna. The radio-frequency coil 514 is connected to a radio frequency transceiver 516. The radio-frequency coil 514 and radio frequency transceiver 516 may be replaced by separate transmit and receive coils and a separate transmitter and receiver. It is understood that the radio-frequency coil 514 and the radio frequency transceiver 516 are representative. The radio-frequency coil 514 is intended to also represent a dedicated transmit antenna and a dedicated receive antenna. Likewise the transceiver 516 may also represent a separate transmitter and receivers. The radio-frequency coil 514 may also have multiple receive/transmit elements and the radio frequency transceiver 516 may have multiple receive/transmit channels. For example if a parallel imaging technique such as SENSE is performed, the radio-frequency could 514 will have multiple coil elements.

The transceiver 516 and the gradient controller 512 are shown as being connected to the hardware interface 106 of a computer system 102. The memory 110 is further shown as containing pulse sequence commands. The pulse sequence commands 530 are commands or data which may be translated into such commands which control the magnetic resonance imaging system 502 to acquire the k-space data 124.

The memory 110 is further shown as containing pulse sequence commands 530. The pulse sequence commands 530 may be used by the processor 104 to control the magnetic resonance imaging system 502 to acquire the measured k-space data 124.

Figure 6:
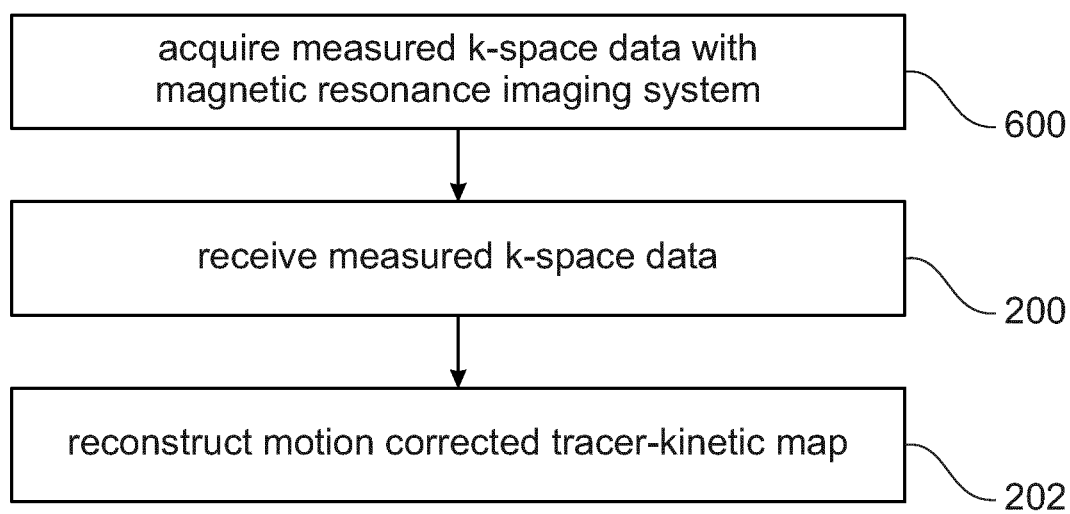
FIG. 6 shows a method of operating the medical system of FIG. 1.

FIG. 6 shows a flowchart which illustrates a method of operating the medical system 500 of FIG. 5. First in step 600 the processor 104 controls the medical system 502 with the pulse sequence commands 530 to acquire the measured k-space data 124. After step 600 is performed the method proceeds to steps 200 and 202 as is illustrated in FIG. 2.

As a specific example, First-pass perfusion cardiac magnetic resonance imaging (FPP-CMR) allows the assessment of coronary heart disease. However, conventional FPP-CMR suffers from low spatial resolution, insufficient heart coverage and requires long breath-holds. At present, perfusion abnormalities are usually identified visually by highly trained physicians. Recently, quantitative analysis of FPP-CMR has emerged as a more reliable and operator-independent approach for identifying perfusion defects. Typically, quantitative FPP-CMR first reconstructs individual dynamic images, which are then converted to contrast agent concentration, and finally, tracer-kinetic modeling is used to generate quantitative myocardial perfusion maps. Here, we propose a model-based FPP-CMR reconstruction approach, which combines image reconstruction and tracer-kinetic modeling, to better exploit the redundancies in the FPP-CMR data. We show that such synergistic approach enables very high undersampling rates at each time frame, and thus allows for much higher spatial resolution and coverage than the traditional method. Furthermore, our proposed method can be combined with respiratory motion correction and k-t undersampling to improve myocardial perfusion quantification, while substantially increasing patient comfort.

Coronary artery disease (CAD) is the leading cause of death worldwide. It is usually caused by atherosclerosis, which reduces blood flow to the heart (myocardial ischemia). Positron emission tomography (PET) is the clinical reference for non-invasive myocardial perfusion quantification in patients with ischemia. Nevertheless, first-pass perfusion cardiac magnetic imaging (FPP-CMR) is rapidly evolving into an essential tool for detecting myocardial perfusion deficits. It has advantages, such as higher spatial resolution, no radiation exposure, wider availability and lower scan cost compared to PET. However, FPP-CMR requires ultra-fast acquisitions (to capture the first pass of a contrast bolus), Electrocardiogram (ECG)-gating and breath-holding techniques to reduce cardiac and respiratory motion, leading to a trade-off between spatial resolution (~2.5 mm) and cardiac coverage (~3 slices). The diagnostic accuracy is also compromised by respiratory induced motion artefacts (patients are often unable to breath-hold) and false-positive defects due to dark-rim artefacts. Moreover, perfusion abnormalities are often identified visually, which has a prognostic value that is dependent on the level of training and experience of the operator.

The lack of reproducible and accurate results are the main factors limiting the widespread clinical adoption of FPP-CMR. Typically, quantitative FPP-CMR methods first involve reconstructing individual dynamic contrast-enhanced images, which are then converted to contrast agent concentration, and finally, tracer-kinetic (TK) modelling is used to generate TK parameter maps; these methods can be referred to as "indirect" methods. Direct model-based parametric reconstruction has been used in PET and few applications in dynamic contrast-enhance MR imaging to directly obtain TK para-meter maps from the acquired data.

This approach showed superior quantitative performance over conventional indirect quantification methods. In addition, direct model-based reconstruction approaches reduce the dimensionality of the problem, i.e., the image reconstruction problem is reduced to finding 2-4 TK parameters maps, instead of ~60 time points per pixel. Therefore, this approach provides accurate TK parameters maps, while also enabling very high acceleration factors by exploiting the redundancy of spatial information between time-points. So far, compressed sensing (CS) and parallel imaging reconstruction approaches have been used to accelerate FPP-CMR acquisitions up to ~8× and achieve higher spatial resolution. In this work, a DIRect QuanTitative (DIREQT) FPP-CMR reconstruction framework is proposed to directly estimate quantitative myocardial perfusion maps from undersampled data. The proposed framework was evaluated on a numerical FPP-CMR phantom and patient with suspected CAD.

The terms DIREQT and DIREQT-TV refer to two different implementations of the magnetic resonance reconstruction module 122 that are formulated as optimization problems.

Figure 7:
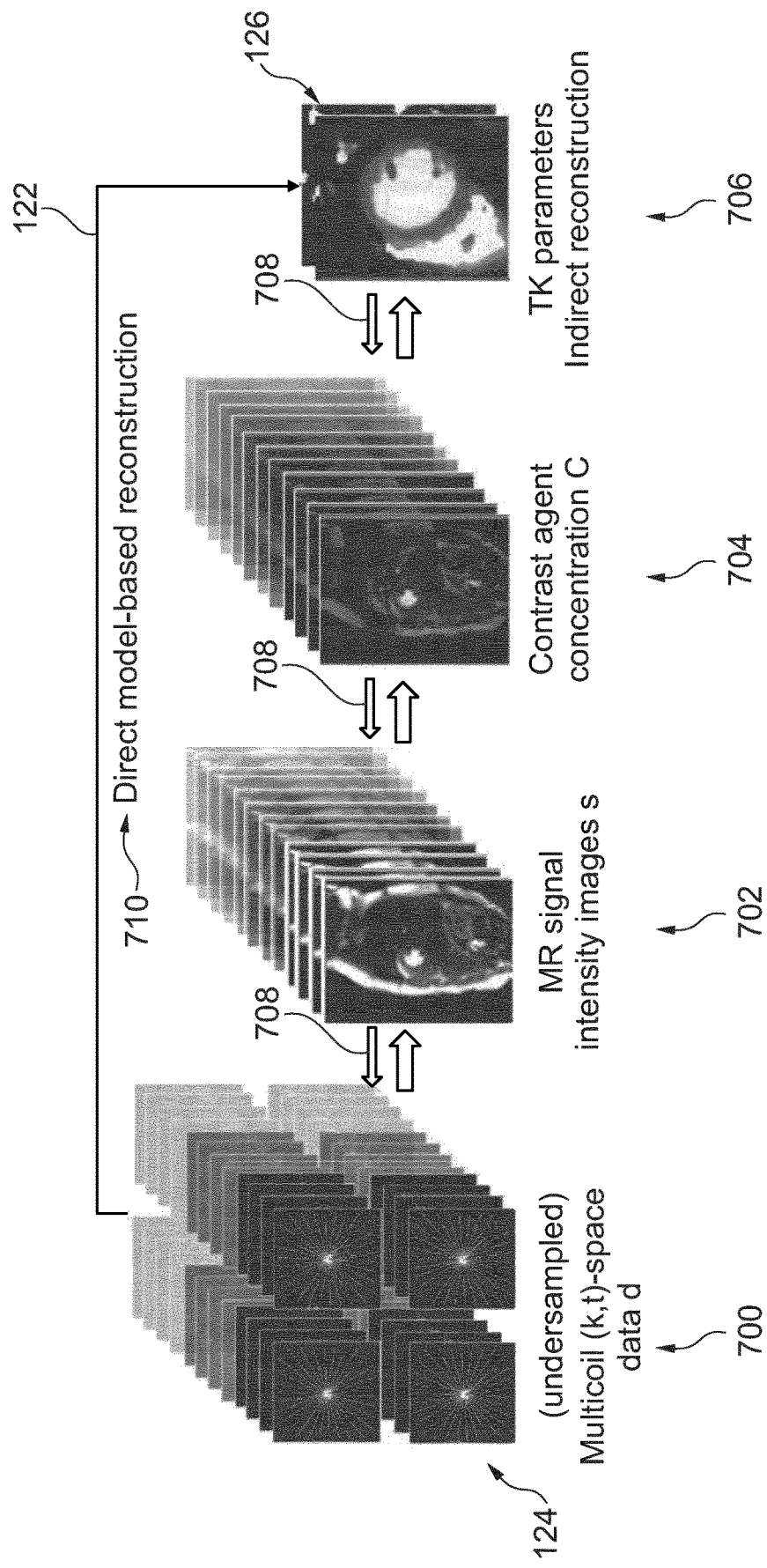
FIG. 7 illustrates several ways of calculating a tracer-kinetic map.

FIG. 7 illustrates two different ways of calculating a motion corrected tracer-kinetic map 126 from measured k-space data 124. In the conventional method first the measured k-space data 124 is acquired in step 700. Next from the measured k-space data 124 a number of magnetic resonance signal and intensity images are reconstructed 702. In the next step the contrast agent concentration 704 is calculated. Finally, from these images 704 an indirect reconstruction 706 of the tracer-kinetic map 126 is reconstructed. In this example a number of images are reconstructed in step 702. For this reason, it may not be possible to acquire undersampled k-space data. An alternative to this is a direct model-based reconstruction 710 that uses the magnetic resonance reconstruction module 122. In this method the motion corrected tracer-kinetic map 126 is calculated directly from the measured k-space data 124. This can be performed in several different ways. In one method a trained convolutional neural network may be used. In another method an optimization problem may be set up and then solved which solves for the motion corrected tracer-kinetic map 126 directly from the measured k-space data 124.

As described above, FIG. 7 shows the steps required in the conventional indirect method (700, 702, 704, 706) and generation of DIREQT forward model (710), which converts TK parameters to (multicoil undersampled) FPP-CMR measurements (k-space data 124).

The proposed DIREQT method directly estimates TK parameters maps from the measured FPP-CMR data. This is achieved by inverting a forward model that includes the operations described below (indicated by the arrows 708 in FIG. 7).

TK parameter maps to contrast agent concentration. The Patlak model is used to estimate the C(r,t) contrast agent concentration over time:

$$C(r,t) = K^{Trans}(r) \int_0^t C_{AIF}(\tau) d\tau + v_p(r) C_{AIF}(t), \quad (1)$$

FIG. 7 shows a flow chart that illustrates the indirect method and proposed DIREQT reconstruction to obtain TK parameters from multicoil (undersampled) data d. The indirect reconstruction consists of three steps (blue arrows): First, FPP-CMR signal intensity images $\mathcal{S}$ are estimated 702 from the acquired (k,t)-space data d. Then, contrast agent concentration over time C is estimated from $\mathcal{S}$. Finally, TK parameters maps are estimated from C. In the DIREQT reconstruction, TK parameters are estimated directly from the (k,t)-space data d (long red arrow) by solving an inverse problem using an iterative reconstruction scheme. The forward model used for the conversion from TK parameter maps to (k,t)-space data d is indicated by the small red arrows.

where r∈(x,y) are the image domain spatial coordinates, $C_{AIF}$ is the arterial input function, $K^{Trans}$ and $v_p$ are TK parameters, representing the contrast transfer coefficient and fractional plasma volume, respectively. The parameter $K^{Trans}$ is related to vascular permeability and blood flow.

Contrast agent concentration to signal intensity. The contrast agent concentration C(r,t) changes $T_1$ according to the following equation:

$$1/T_1(r,t) = 1/T_1(r,0) + \gamma C(r,t), \quad (2)$$

where $T_1(r, 0)$ is the precontrast $T_1$ and $\gamma$ is the contrast agent relaxivity. The dynamic contrast-enhanced image series $\mathcal{S}$ (r, t) is related to $T_1$ by the saturation-recovery prepared fast gradient echo signal equation:

$$\mathcal{S}(r, t) = \mathcal{S}_0(r)\left[(1 - e^{-T_S R_1})a^{n-1} + (1 - e^{-T_R R_1})\frac{1 - a^{n-1}}{1 - a}\right] \quad (3)$$

where $\mathcal{S}_0(r)$ is proportional to the equilibrium longitudinal magnetization, $T_S$ is the saturation time, $T_R$ is the repetition time, n is the number of excitation pulses applied before acquiring the k-space center, $R_1 = 1/T_1$ and $\alpha = \cos \alpha \, e^{-T_R R_1}$, which contains the flip angle $\alpha$. Eq. 3 above is different than Eq. 2 of Guo et. al.

The under sampled (k,t)-space data d(k,t) are related to $\mathcal{S}$ (r,t) as follows:

$$d(k,t) = A(k,t)\mathcal{F} S(r)\mathcal{S}(r,t), \quad (4)$$

where $k \in (k_x, k_y)$ represents k-space coordinates, A(k,t) is the (k,t)-space sampling trajectory, F is the Fourier transform and S(r) are the coil sensitivities. Hence, The DIREQT forward problem is given by:

$$d(k,t) = f(K^{Trans}(r), v_p(r)), \quad (5)$$

where f is the forward model that combines Eqs. (1)-(4). Therefore, the TK parameter maps can be estimated by solving the following optimization problem:

$$(\hat{K}^{Trans}(r), \hat{v}_p(r)) = \underset{K^{Trans}(r), v_p(r)}{\arg\min} \; \|d(k, t) - f(K^{Trans}(r), v_p(r))\|_2^2. \quad (6)$$

If motion correction is performed in k-space then Eq. 6 can be modified such that d is replaced by b, which is the translational motion corrected k-space data.

Spatial sparsity constrains on the TK parameter maps can be added to Eq. (6):

$$(\hat{K}^{Trans}(r), \hat{v}_p(r)) = \underset{K^{Trans}(r), v_p(r)}{\arg\min} \quad (7)$$
$$\{\|d(k, t) - f(K^{Trans}(r), v_p(r))\|_2^2 + \beta\|\nabla_s v_p(r)\|_1 + \alpha\|\nabla_s K^{Trans}(r)\|_1\}$$

where $\nabla_s$ is the 2D spatial finite differences operator, $\alpha$ and $\beta$ are regularization parameters or any other sparsity constraint, e.g. wavelet sparsity constraints. A limited memory BFGS quasi-Newton method is used to solve this nonlinear inverse problem.

To solve the indirect problem, individual dynamic contrast-enhanced images may be reconstructed from under sampled (k,t)-space data by solving the following optimization problem:

$$\mathcal{S}(r, t) = \underset{\mathcal{S}(r,t)}{\arg\min}\{\|d(k, t) - A(k, t)\mathcal{F}S(r)\mathcal{S}(r, t)\|_2^2 + \alpha\|\nabla_s \mathcal{S}(r, t)\|_1 + \beta\|\nabla_t \mathcal{S}(r, t)\|_1\} \quad (8)$$

where $\nabla_t$ is the finite differences operator along the temporal dimension. Then, the change in concentration C(r,t) is derived from the signal intensity, and finally, TK parameters maps are obtained from C(r,t), by solving the inverse problems of Eq. (3) and Eq. (1), respectively.

The above direct formulation can be modified for motion compensation by modifying Eq. 4 and either Eq. 6 or Eq. 7. The undersampled (k,t)-space data d(k,t) are related to $\mathcal{S}$ (r,t) as follows to replace Eq. 4:

$$d(k,t) = A(k,t)\mathcal{F} S(r)M(r,t)\mathcal{S}(r,t), \quad (9)$$

where M(r,t) are the (nonrigid) motion fields at each time frame t.

The regularization on M can be based on the stored energy function of an hyperelastic material, such as Saint Venant-Kirchhoff or Ogden materials. This leads to the following minimization problem to replace Eq. 6 above:

$$(TK(r), M(r, t)) = \quad (10)$$
$$\underset{TK(r), M(r,t)}{\arg\min} \{norm[d(k, t) - f(TK(r), M(r, t))] + R(M(r, t))\}$$

wherein r is the spatial position, wherein t is the time, wherein TK(r) is the terms of a tracer-kinetic map, wherein R(M(r,t)) is the motion compensating regularization term, wherein d(k,t) is the measured k-space data, wherein M(r,t) is a deformation map, wherein f(TK(r), M(r,t)) is a forward model of k-space data for a given TK(r) and M(r,t), and wherein norm is a mathematical norm.

The hyperelasticity-based regularizer, $R_{hyper}$, allows for large and smooth deformations while maintaining an elastic behavior. Other models could be used such as, curvature based regularization, affine transformations and free-form deformations (FFD) parameterized using cubic B-splines models, etc. This problem can be solved using an alternating minimization scheme.

Similarly, Eq. 7 can be reformulated as:

$$(\hat{K}^{Trans}(r), \hat{v}_p(r), M(r, t)) = \quad (11)$$
$$\underset{K^{Trans}(r), \hat{v}_p(r), M(r,t)}{\arg\min} \{norm[d(k, t) - f(K^{Trans}(r), \hat{v}_p(r), M(r, t))] +$$
$$R(M(r, t)) + \beta\|\nabla_s v_p(r)\|_1 + \alpha\|\nabla_s K^{Trans}(r)\|_1\}$$

The equations 10 and 11 may be further modified by removing the regularization terms R(M (r,t)), $\beta\|\nabla_s v_p(r)\|_1$, and/or $\alpha\|\nabla_s K^{Trans}(r)\|_1$. The presence of the deformation map M(r,t) still enables motion correction. The presence of the regularization terms in the single optimization problem aids in motion correction. However, removing the regularization terms enables the single optimization problem to be solve more rapidly. It is numerically less demanding. Removing the regularization terms is then a trade off between how well motion is compensated for with computational efficiency.

Fully-sampled FPP-CMR data was generated using the MRXCAT numerical phantom and the following parameters: field-of-view (FOV): 320×320×80 mm³, spatial resolution: 2×2 mm², slice thickness: 5 mm, TS/TR/TE: 150.0/ 2.0/1.0 ms, flip angle: 15°, contrast agent dose: 0.075 mmol/kg, contrast agent relaxivity: 5.6 L/mmol·s, 6 receiver coils, 32 time frames and population average $C_{AIF}$. A radial k-t sampling strategy was used to undersample acquisitions by a factor of 10, 20, 30 and 40. Gaussian noise was added to each dataset to obtain a contrast-to-noise ratio (CNR) of 40. Six noise realizations were performed for each undersampling rate. DIREQT and indirect reconstructions were obtained from the undersampled datasets.

In-vivo experiments were also performed. A rest FPP-CMR fully-sampled acquisition was performed in one patient with suspected CAD using a dual bolus technique with 0.0075+0.075 mmol/kg of Gadobutrol (Gadovist; Bayer, Germany) and a 3T scanner (Achieva; Philips Healthcare). A saturation-recovery turbo field echo (TFE) ECG-triggered sequence was used to acquire a single short-axis slice in free-breathing using the following parameters: FOV: 320×320 mm², resolution: 2.8×2.8 mm², slice thickness: 10 mm, TS/TR/TE: 120.0/1.96/0.93 ms, flip angle: 15°, acquisition window: 224.3 ms, total acquisition time: 1 min 20 s, contrast agent relaxivity: 5.0 L/mmol·s. The same radial sampling strategy used in the simulations was used to generate a 20×, 30× and 40× undersampled datasets. The $C_{AIF}$ was found using a large region of interest drawn in the left ventricle and the precontrast $T_1(r,0)$ was extracted from a T1 mapping sequence. In addition, the signal intensity was normalized to the precontrast signal.

To perform motion correction, the free-breathing FPP-CMR acquisition was initially reconstructed using the vendors default reconstruction. The dynamic images were used to estimate the frame-by-frame translational motion by registering every frame to the sliding average of its predecessor (±7 frames). Then, translational motion correction was performed directly in k-space by applying a linear phase shift. Finally, these motion-corrected datasets were reconstructed using the indirect and DIREQT methods. The value of adding spatial sparsity constraints on the TK parameters maps, in the form of spatial total variation (TV) regularization (see Eq. (7)), was also tested. The regularization parameters were selected empirically for all methods.

TK parameters maps obtained with the DIREQT and indirect methods were quantitatively evaluated against the reference (fully-sampled) TK parameters maps using the normalized mean square error (NMSE) and correlation coefficient (CC). Reconstructions were performed using MATLAB (MathWorks, USA) on an Intel i7-86508 @ 1.9 GHz laptop with 32 GB memory.

Figure 8:
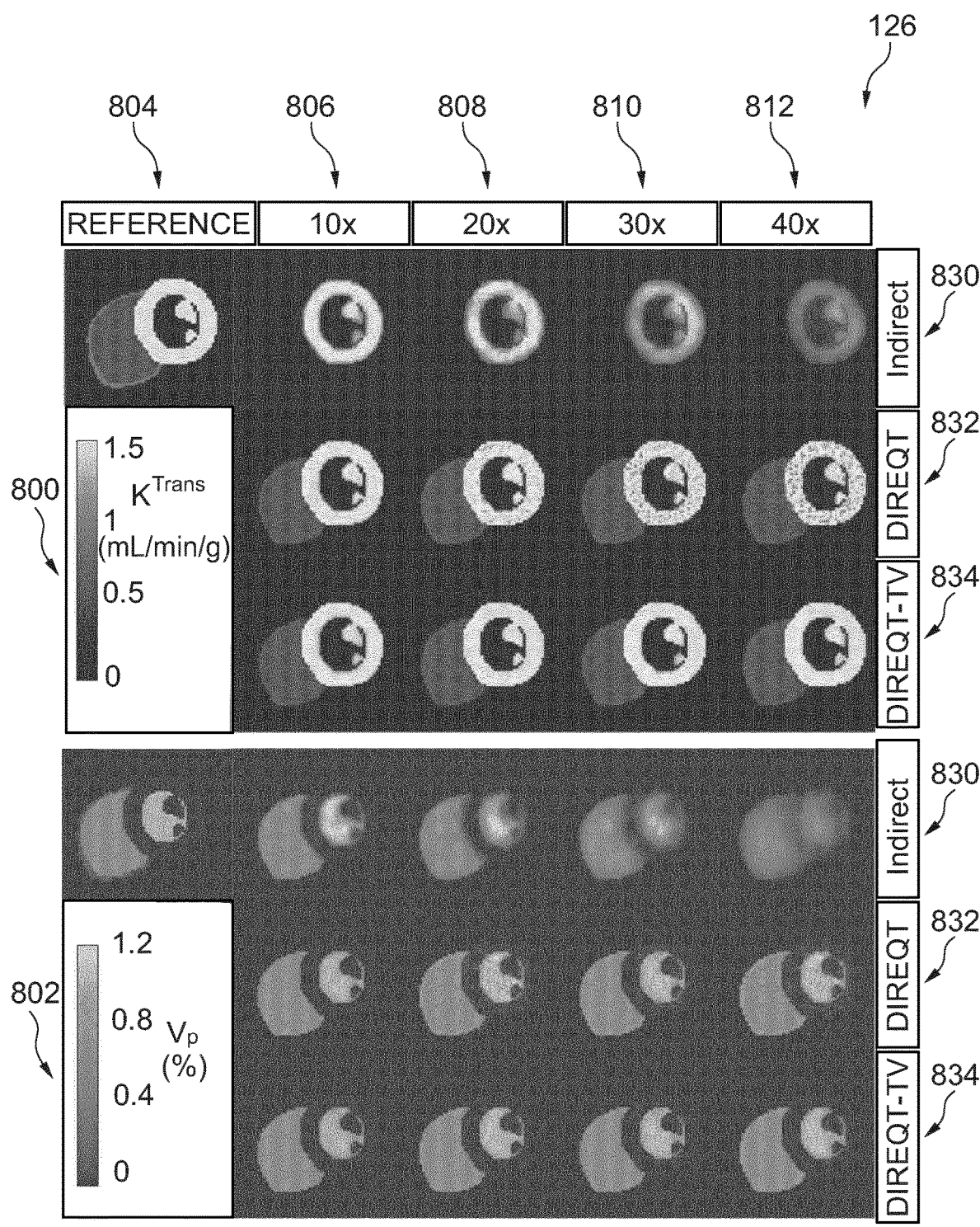
FIG. 8 compares several different algorithms for calculating a tracer-kinetic map.

FIG. 8 compares several different ways of calculating motion corrected tracer-kinetic maps 126. In this example there are two different quantities which are calculated as part of the map 126. There is $K^{Trans}$ 800 and $v_p$ 802. Calculations are done for fully sampled measurements 804, for 10× undersampling 806, for 20× undersampling 808, 30× undersampling 810, and 40× undersampling 812. Each of these is done for three different algorithms. This is done for the indirect method 830 which is illustrated by steps 700, 702, 704, and 706 in FIG. 7 and then using the DIREQT 832 algorithm and the DIREQT-TV algorithm 834. From FIG. 8 it can be seen that both the DIREQT-TV 834 and the DIREQT 832 do an excellent job of calculating the values $K^{Trans}$ 800 and $v_p$ 802 even at high rates of undersampling. FIG. 8 shows the DIREQT reconstructions, with and without TV regularization, obtained from simulated undersampled data together with the fully-sampled reference and indirect reconstructions. For the indirect method, the image quality of the TK maps at acceleration 10× is comparable to the reference images. For higher acceleration rates, the quality of the TK parameters maps rapidly deteriorates and false perfusion defects become visible. In comparison, the overall image quality of the TK parameter maps obtained with DIREQT is superior to the indirect method at all levels of undersampling. However, at high acceleration rates the DIREQT problem becomes ill-posed, which leads to noise amplification. In these instances, regularization strategies can be employed to stabilize the solution. FIG. 8 shows that TV regularization helps reduce noise amplification at high accelerations and it also improves the convergence rate.

Figure 9:
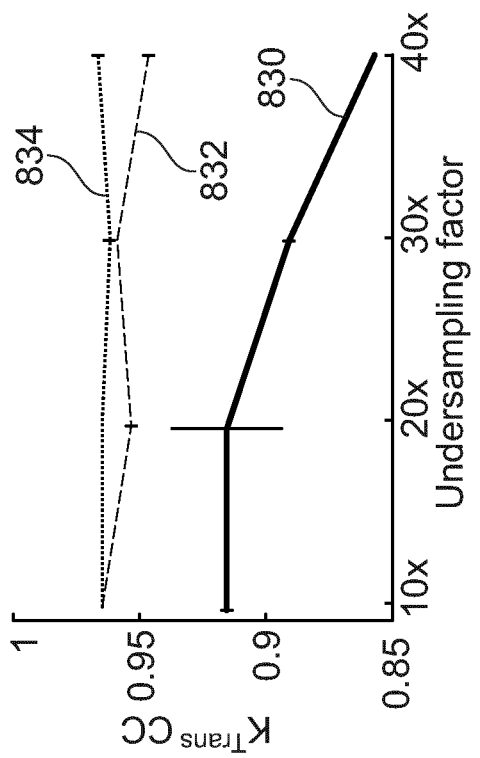
FIG. 9 further compares several different algorithms for calculating a tracer-kinetic map.
Figure 9:
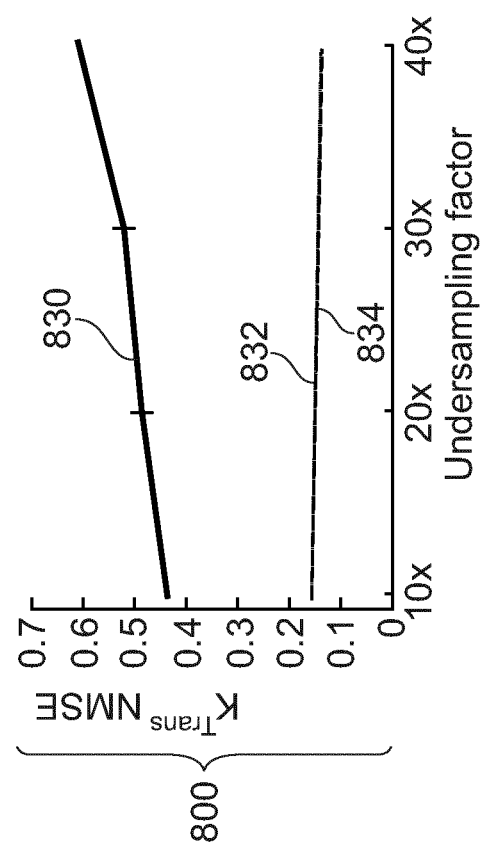
Figure 9:
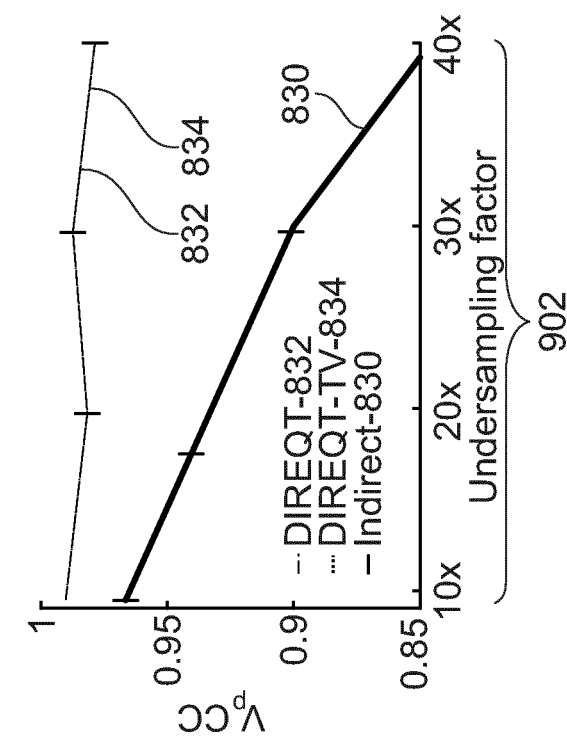
Figure 9:
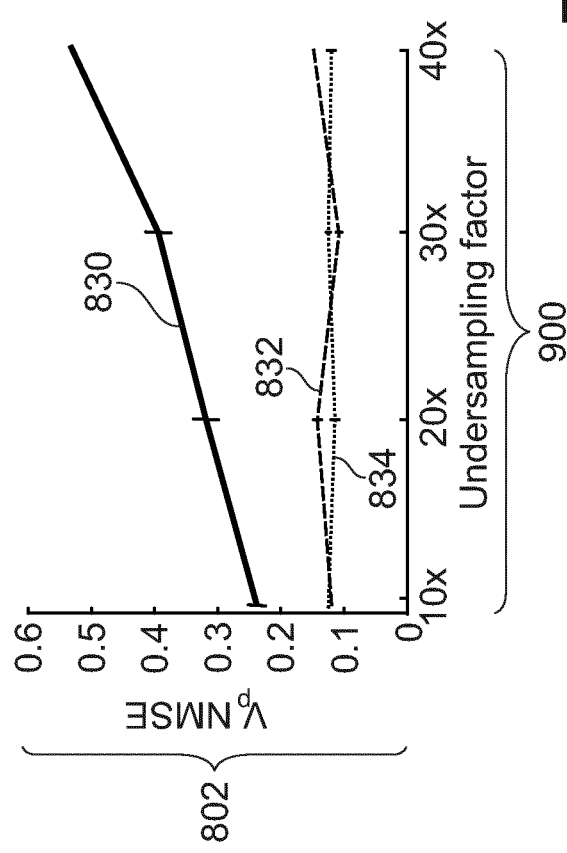

FIG. 9 shows the normalized mean square error 900 and the correlation coefficient 902 between the reference images and the TK maps for $K^{Trans}$ 800 and $v_p$ 802 for the indirect algorithm 830, the DIREQT algorithm 832 and the DIREQT-TV 834 algorithm. FIG. 9 shows the quantitative results of the TK parameter reconstructions. The highest CC and lowest NMSE values were achieved with the proposed DIREQT method, indicating a better agreement with the reference images.

Figure 10:
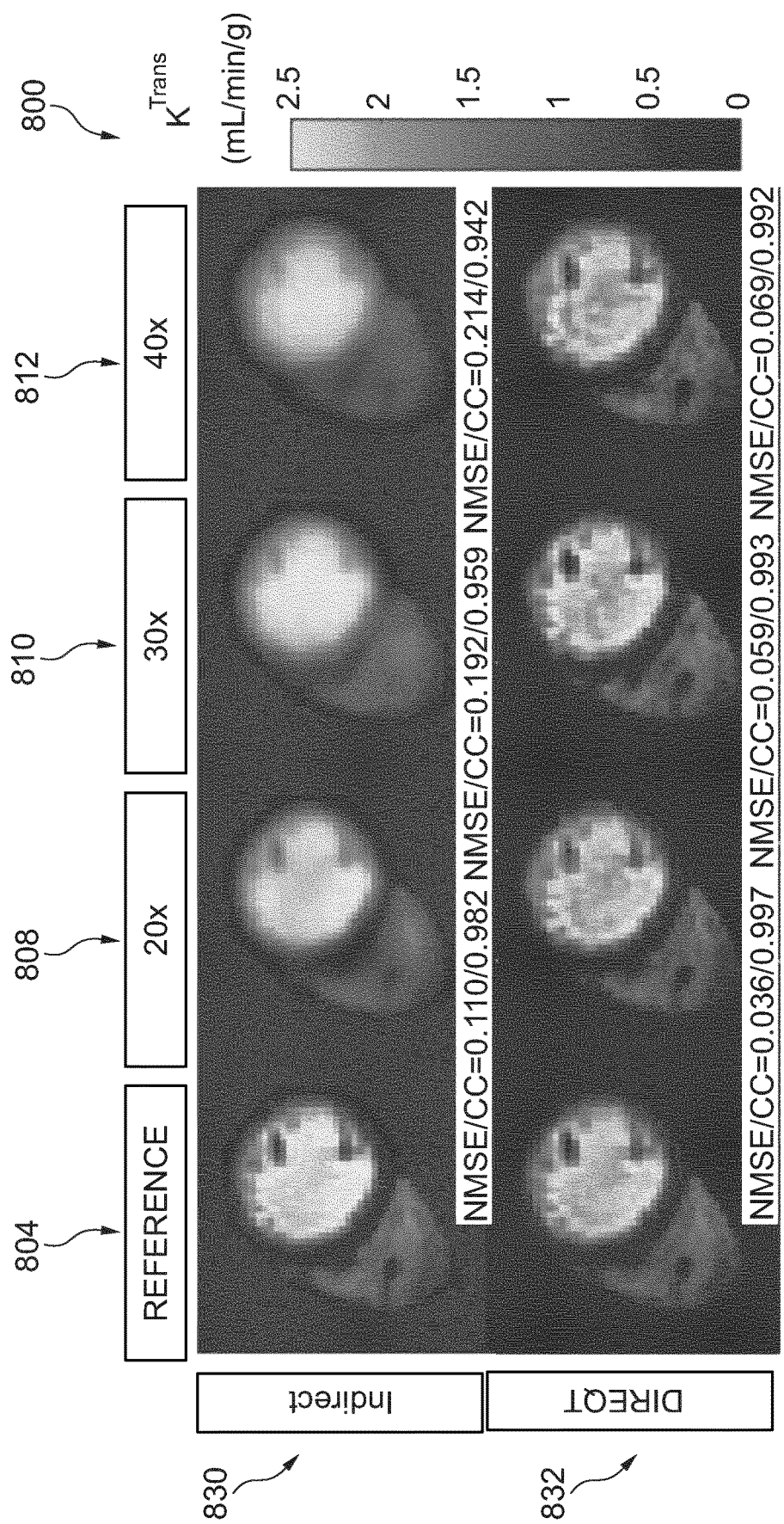
FIG. 10 further compares several different algorithms for calculating a tracer-kinetic map.

FIG. 10 shows numerical phantom $K^{Trans}$ and $v_p$ reconstructions obtained from 10×, 20×, 30× and 40× undersampled data using the indirect method, proposed DIREQT and DIREQT with TV regularization (DIREQT-TV). The reference images are displayed for comparison. The proposed DIREQT generates high-quality TK maps even at very high undersampling rates.

FIG. 10 illustrates a difference between the indirect 830 algorithm and the dreqt 832 algorithm for the $K^{Trans}$ reconstructions that are obtained from fully sampled measurements 804, 20× undersampled measurements 808, 30× undersampled measurements 810, and 40× undersampled measurements 812 of patient data. Finally, FIG. 10 displays the TK parameter maps estimated from fully-sampled and undersampled patient data using DIREQT. Note that FPP-CMR data was acquired without breath-holding, for improved patient comfort, and to minimize respiratory motion artefacts, which can greatly affect the quantification results. The proposed method yields good results even at a high acceleration rates. The total reconstruction times for the indirect and DIREQT methods were ~290 s and ~185 s, respectively.

The Patlak model was chosen in this work because it provides results comparable to other TK models normally used in FPP-CMR, such as Fermi and two-compartment model, with the advantage that it can be linearized, which simplifies calculations. However, a comparison between different TK models, including the blood tissue exchange (BTEX) model, will be the subject of a future study. Furthermore, other regularization strategies could be employed that could further increase the robustness of the proposed method against noise, pushing the acceleration further. In future studies, the DIREQT method will be evaluated in a large cohort of patients with suspected CAD using prospective undersampled acquisitions. These studies will also aim to achieve much higher spatial resolution and coverage, and hence, greater diagnostic accuracy.

Various techniques can be used for k-t sampling and to provide for a dynamic acquisition scheme. Cardiac dynamic (parallel) images have a high degree of spatial-temporal correlations and redundancies because the background is static and the dynamic regions (or contrast changes) are relatively small.

In order to exploit the spatial-temporal correlations and redundancy of the whole dynamic FPP-CMR series and, hence, achieve a high degree of incoherence, a dynamic undersampling pattern can be used, i.e., a different k-space undersampling pattern at each time point t. These k-t sampling trajectories acquire data in a way that the signal overlap is minimised. Therefore, the generated aliasing artefacts add incoherently. This is in contrast with the more standard approach of acquiring a fully-sampled, partial Fourier or parallel imaging accelerated FPP-CMR data set at each time frame individually. DIREQT also works with this standard approach, but higher accelerations can be reached using a k-t sampling strategy.

This can be achieved, for example, by using Cartesian or non-Cartesian trajectories with spiral or radial ordering and golden angle or tiny golden angle increments or with a non-repeating Poisson-disk sampling trajectory. The sampling can have higher density at the centre of k-space, but it is not a requirement.

DIREQT also does not require training data or profiles, such as, for example, k-t SENSE and k-t PCA approaches. However, DIREQT can be used in combination with these types of techniques. DIREQT can also be combined with other FPP-CMR acquisitions strategies, including simultaneous multi-slice imaging.

In summary, the recovery of the TK parameter maps is facilitated by the fact that the FPP-CMR dynamic frames are correlated in space and time. The use of k-t trajectories with DIREQT allows to greatly reduce the amount of data necessary to obtain high-quality TK parameter maps and, in addition, allows to improve spatial and temporal resolutions.

Respiratory motion and heart contraction degrade FPP-CMR image quality. These rigid and nonrigid deformations limit FFP-CMR quantification accuracy. Therefore, in order to obtain accurate quantitative maps, the first-pass data must be motion compensated to minimise for the resulting artefacts. The proposed DIREQT method can be combined with motion correction techniques to provide accurate quantitative maps from highly accelerated free-breathing and/or continuously acquired data.

Several approaches can be used to minimize respiratory and cardiac motion. For example, the most common strategies use ECG triggering to freeze cardiac motion and breath holding to reduce respiratory motion. Alternatively, self-navigation techniques can be used to extract motion information directly from the data or auxiliary acquisition. This motion information can be used retrospectively to correct the acquired data. For example, translational motion correction can be performed directly in k-space by applying a linear phase shift. Alternatively, data binning can be performed to separate the data into different respiratory motion states and/or cardiac phases. In addition, affine or nonrigid motion can be estimated and corrected iteratively. Therefore, the framework can be formulated to jointly estimate motion and motion-corrected quantitative maps directly from FPP-CMR data. Moreover, the problem can also be formulated in a way that the arterial input function can be jointly estimated together with the TK parameters maps and motion. A population AIF could be used as an initial estimate.

Deep learning can also be used to reconstruct motion corrected tracer-kinetic maps. DIREQT reconstruction of 3D volumes can potentially require long computational times. A potential solution to accelerate reconstruction time is to use a deep learning approach to directly estimate TK parameter maps from undersampled FPP-CMR data (DIREQT-NET). One of the main advantages of deep learning based reconstruction techniques is the computational efficiency, which enables real-time applications.

One approach to solve Eq. (5) using deep learning is to directly learn the nonlinear mapping between the undersampled k-space data d or aliased zero-filled undersampled reconstruction and the fully-sampled TK parameter maps using a deep neural network (e.g. convolutional neural network, CNN). Hence, the training step consists of pairs of undersampled k-space (or images) and the desired ground-truth TK parameter maps. Then, the reconstruction can be trained in an end-to-end fashion, in which TK parameter maps are reconstructed with the network from undersampled data and compared to the ground-truth.

Then, the trained CNN can be used to generate artefact-free TK parameter maps from undersampled FPP-CMR data. For very high acceleration rates (where regularization may be used to stabilize the DIREQT reconstruction), prior information or regularization are learnt implicitly from the undersampled data (or images). Hence, these do not have to be specified during training. Alternatively, a deep residual learning strategy can be used, in this case the network learns residual parameter maps (between the corrupted and ground truth TK maps), which has a sparser and simpler representation than the parameter maps. Therefore, the network is trained to learn the mapping between the undersampled k-space data (or image) and TK parameter maps and output an estimate of residual maps. If k-space is the input data, the neural network can be composed of fully-connected layers followed by a CNN. The main function of the fully-connected layers is to learn the nonlinear mapping between k-space and the image domain. Alternatively, an unrolled iterative network can be used, which enforces that the reconstruction is consistent with the k-space data.

Several loss functions can be used to train deep neural networks. A popular choice is the mean squared error between the TK parameter map estimate and ground truth (or residual). The forward physical model loss function between the input data and model generated data (Eq. 5) could also be included.

If the ground truth is available, the network can be trained in an end-to-end fashion. However, it may be unfeasible to acquire fully-sampled 2D high-resolution or 3D whole-heart FPP-CMR data. Therefore, if the ground truth image is not available, an unsupervised deep learning approach can be used to jointly solve for the CNN weights and the reconstructed training set parameter maps.

The CNN weights may be referred to as weighting factors for the CNN or other types of neural networks.

Typically, deep learning requires a large number of datasets for training, which are often not available in FPP-CMR. Nevertheless, it is still possible to train a network using data augmentation techniques, which can be used to increase the number of datasets and prevent overfitting.

Other deep neural networks than CNNs can be used for DIREQT-NET, such as recurrent neural networks, (cycle) generative adversarial networks, Bayesian neural networks, ADMM-Net, etc.

The use of a Bayesian neural network may be beneficial because it may additionally provide uncertainty maps which may be useful in assessing the accuracy of the motion corrected tracer-kinetic map.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 medical system
102 computer
104 processor
106 hardware interface
108 user interface
110 memory
120 machine executable instructions
122 magnetic resonance reconstruction module
124 measured k-space data
126 motion corrected tracer-kinetic map
200 receive the measured k-space data
202 reconstruct the motion corrected tracer-kinetic map by inputting the measured k-space data into the magnetic resonance reconstruction module
300 medical system
302 motion corrected k-space data
400 calculate the tracer kinetic map by inputting the motion corrected k-space data into the magnetic resonance reconstruction module
500 medical system
502 magnetic resonance imaging system
504 magnet
506 bore of magnet
508 imaging zone
509 field of view
510 magnetic field gradient coils
512 magnetic field gradient coil power supply
514 radio-frequency coil
516 transceiver
518 subject
520 subject support
530 pulse sequence commands
600 control the magnetic resonance imaging system with the pulse sequence commands to acquire the measured k-space data
700 multicoil (k,t)-space data
702 MR signal intensities s
704 contrast agent concentrations
706 indirect reconstruction
708 arrows
710 direct model-based reconstruction
800 $K^{Trans}$
802 $v_p$
804 fully sampled
806 10× undersampled
808 20× undersampled
810 30× undersampled
812 40× undersampled
830 indirect
832 DIREQT
834 DIREQT-TV
900 normalized mean square error
902 correlation coefficient

The invention claimed is:

1. A medical system comprising:
a memory storing non-transitory machine executable instructions and a magnetic resonance reconstruction module, wherein the magnetic resonance reconstruction module is configured to reconstruct a motion corrected tracer-kinetic map from measured k-space data, wherein the measured k-space data is undersampled, wherein the measured k-space data is T1 weighted, wherein the measured k-space data is dynamic contrast enhanced k-space data; and
a processor configured for controlling the medical system, wherein execution of the machine executable instructions by the processor causes the processor to:
receive the measured k-space data;
reconstruct the motion corrected tracer-kinetic map by inputting the measured k-space data into the magnetic resonance reconstruction module, wherein the magnetic resonance reconstruction module is a neural network trained to output the motion corrected tracer-kinetic map in response to the inputting of the measured k-space data as a direct model-based reconstruction from the measured k-space data; and
store the reconstructed motion corrected tracer-kinetic map in the memory.

2. A medical system comprising:
a memory storing non-transitory machine executable instructions and a magnetic resonance reconstruction module, wherein the magnetic resonance reconstruction module is configured to reconstruct a motion corrected tracer-kinetic map from measured k-space data, wherein the measured k-space data is undersampled, wherein the measured k-space data is T1 weighted, wherein the measured k-space data is dynamic contrast enhanced k-space data; and
a processor configured for controlling the medical system, wherein execution of the machine executable instructions by the processor causes the processor to:
receive the measured k-space data;
reconstruct the motion corrected tracer-kinetic map by inputting the measured k-space data into the magnetic resonance reconstruction module, wherein the magnetic resonance reconstruction module is configured to reconstruct the motion corrected tracer-kinetic map as a direct model-based reconstruction from the measured k-space data; and
store the reconstructed motion corrected tracer-kinetic map in the memory;
wherein the magnetic resonance reconstruction module is configured for solving for the motion corrected tracer-kinetic map as an optimization problem, and wherein the optimization problem is formulated as a minimization of a motion compensating regularization term plus a norm of a difference between the measured k-space data and a k-space model configured to map the motion corrected tracer-kinetic map to the under sampled k-space data.

3. A method of operating a medical system, wherein the method comprises, with a processor:
receiving measured k-space data; and
reconstructing a motion corrected tracer-kinetic map by inputting the measured k-space data into a magnetic resonance reconstruction module, wherein the magnetic resonance reconstruction module is configured to reconstruct a motion corrected tracer-kinetic map from measured k-space data, wherein the measured k-space data is under sampled, wherein the measured k-space data is T1 weighted, wherein the measured k-space data is dynamic contrast enhanced k-space data, wherein the magnetic resonance reconstruction module is configured to reconstruct the motion corrected tracer-kinetic map as a direct model-based reconstruction from the measured k-space data; and storing the reconstructed motion corrected tracer-kinetic map in the memory;

wherein the magnetic resonance reconstruction module is configured for solving for the motion corrected tracer-kinetic map as an optimization problem, and wherein the optimization problem is formulated as a minimization of a norm of a difference between the measured k-space data and a k-space model configured to map the motion corrected tracer-kinetic map to the under sampled k-space data.

4. A computer program product comprising non-transitory machine executable instructions for execution by a processor controlling a medical system, wherein the machine executable instructions comprise magnetic resonance reconstruction module configured to reconstruct a motion corrected tracer-kinetic map from measured k-space data, wherein the magnetic resonance reconstruction module is configured to reconstruct the motion corrected tracer-kinetic map as a direct model-based reconstruction from the measured k-space data, wherein the measured k-space data is under sampled, wherein the measured k-space data is T1 weighted, wherein the measured k-space data is dynamic contrast enhanced k-space data, wherein execution of the machine executable instructions causes the processor to:

receive the measured k-space data; and reconstruct the motion corrected tracer-kinetic map by inputting the measured k-space data into the magnetic resonance reconstruction module;

wherein the tracer-kinetic map is a mapping of any one of the following: a relative extracellular volume, an intravascular plasma volume, a plasma flow, permeability-surface area product, a tissue extracellular extravascular space, an influx mass transfer rate of a contrast agent, a myocardial blood flow, and combinations thereof.

5. The medical system of claim 2, wherein the regularization term is formulated from a deformation map of the motion corrected tracer-kinetic map, wherein the deformation map has a time and spatial dependency.

6. The medical system of claim 5, wherein the regularization term is further formulated as any one of the following:

a stored energy function dependent upon the deformation map;

a hyperelastic material model dependent upon the deformation map;

a curvature-based regularization term dependent upon the deformation map;

a free-form deformation model that uses a cubic B-spline model dependent upon the deformation map; and an affine transformation model dependent upon the deformation map.

7. The medical system of claim 2, wherein the motion compensating regularization term is a non-rigid motion compensating regularization term.

8. The medical system of claim 2, wherein the motion compensating regularization term is a rigid motion compensating regularization term.

9. The medical system of claim 2, wherein the optimization problem comprises:

$$(TK(r), M(r, t)) = \arg\min_{TK(r), M(r,t)} \{norm[d(k, t) - f(TK(r), M(r, t))] + R(M(r, t))\}$$

wherein r is the spatial position, wherein t is the time, wherein TK(r) is the terms of a tracer-kinetic map, wherein R (M(r, t)) is the motion compensating regularization term, wherein d(k, t) is the measured k-space data, wherein M(r, t) is a deformation map, wherein f(TK(r), M(r, t)) is a forward model of k-space data for a given TK(r) and M(r, t), and wherein norm is the norm.

10. The medical system of claim 2, wherein the optimization problem is a single optimization problem that directly solves for the motion corrected tracer-kinetic map from the measured k-space data.

11. The medical system of claim 1, wherein the neural network is trained using any one of the following: motion corrected tracer-kinetic maps paired with simulated motion corrupted k-space data; using unsupervised deep learning approach to jointly solve for weighting factors and reconstructed training set parameter maps; and combinations thereof.

12. The medical system of claim 11, wherein the neural network is any one of the following: a convolutional neural network, a deep neural network, a recurrent neural network, a pair of generative adversarial neural networks, a pair of cycle generative adversarial neural networks, a Bayesian neural networks, and an ADMM-Net.

13. The medical system of claim 1, wherein the magnetic resonance reconstruction module is configured for solving for the motion corrected tracer-kinetic map as an optimization problem or is a trained convolutional neural network.

14. The medical system of claim 1, wherein the tracer-kinetic map is a mapping of any one of the following: a relative extracellular volume, an intravascular plasma volume, a plasma flow, permeability-surface area product, a tissue extracellular extravascular space, an influx mass transfer rate of a contrast agent, a myocardial blood flow, and combinations thereof.

15. The medical system of claim 1, wherein the measured k-space data is first-pass perfusion cardiac k-space data or abdominal dynamic contrast enhanced k-space data.

16. The medical system of claim 1, wherein any one of the following: the measured k-space data is under sampled by at least a factor of 5, the measured k-space data is under sampled by at least a factor of 10, the measured k-space data is under sampled by over a factor of 20, the measured k-space data is under sampled by at least a factor of 30, the measured k-space data is under sampled by at least a factor of 40, the measured k-space data is under sampled by at least a factor of 50, the measured k-space data is under sampled by at least a factor of 60, the measured k-space data is under sampled by at least a factor of 70, and the measured k-space data is under sampled by at least a factor of 80.

17. The medical system of claim 1, wherein the medical system further comprises a magnetic resonance imaging system configured for acquiring the measured k-space data from an imaging zone, wherein the memory further contains pulse sequence commands, wherein the pulse sequence commands are configured to acquire the measured k-space data according to a first-pass perfusion cardiac magnetic resonance imaging protocol or an abdominal dynamic contrast enhanced magnetic resonance imaging protocol, wherein execution of the machine executable instructions further causes the processor to control the magnetic resonance imaging system with the pulse sequence commands to acquire the measured k-space data.

18. The medical system of claim 17, wherein the pulse sequence commands are configured for acquiring the k-space data using a self-navigating k-space sampling pattern.

19. The method of claim 3, wherein the optimization problem comprises:

$$(TK(r), M(r, t)) = \underset{TK(r),M(r,t)}{\arg\min} \{norm[d(k, t) - f(TK(r), M(r, t))]\}$$

wherein r is the spatial position, wherein t is the time, wherein TK(r) is the terms of a tracer-kinetic map; wherein d(k, t) is the measured k-space data, wherein M(r, t) is a deformation map, wherein f(TK(t), M(r, t)) is a forward model of k-space data for a given TK(r) and M(r, t), and wherein norm is a mathematical norm.

\* \* \* \* \*